United States Patent
Ku et al.

(10) Patent No.: US 12,175,181 B1
(45) Date of Patent: Dec. 24, 2024

(54) TIMING-AWARE SURGICAL OPTIMIZATION FOR ENGINEERING CHANGE ORDER IN CHIP DESIGN

(71) Applicant: Synopsys, Inc., Mountain View, CA (US)

(72) Inventors: Bon Woong Ku, Santa Clara, CA (US); Nahmsuk Oh, Palo Alto, CA (US); Cho Moon, San Jose, CA (US)

(73) Assignee: Synopsys, Inc., Sunnyvale, CA (US)

( * ) Notice: Subject to any disclaimer, the term of this patent is extended or adjusted under 35 U.S.C. 154(b) by 495 days.

(21) Appl. No.: 17/541,851

(22) Filed: Dec. 3, 2021

Related U.S. Application Data

(60) Provisional application No. 63/121,853, filed on Dec. 4, 2020.

(51) Int. Cl.
*G06F 30/398* (2020.01)
*G06F 30/394* (2020.01)

(52) U.S. Cl.
CPC .......... *G06F 30/398* (2020.01); *G06F 30/394* (2020.01)

(58) Field of Classification Search
CPC .............................. G06F 30/398; G06F 30/394
See application file for complete search history.

(56) References Cited

U.S. PATENT DOCUMENTS

| | | | | |
|---|---|---|---|---|
| 6,701,505 B1 * | 3/2004 | Srinivasan | ............ | G06F 30/327 716/134 |
| 7,111,268 B1 * | 9/2006 | Anderson | ............. | G06F 30/392 716/132 |
| 7,739,630 B1 * | 6/2010 | Chen | ....................... | G06F 30/39 716/136 |
| 8,196,081 B1 * | 6/2012 | Arslan | .................. | G06F 30/392 716/108 |
| 8,789,005 B1 * | 7/2014 | Umino | .................. | G06F 30/398 716/135 |
| 9,471,741 B1 * | 10/2016 | Folberth | ............... | G06F 30/392 |
| 9,483,597 B1 * | 11/2016 | Das | ......................... | G06F 30/39 |
| 9,633,159 B1 * | 4/2017 | Parikh | ..................... | H01L 21/00 |
| 9,646,126 B1 * | 5/2017 | Lu | ....................... | G06F 30/3312 |
| 9,773,083 B1 * | 9/2017 | Das | ........................ | G06F 30/394 |
| 10,416,232 B1 * | 9/2019 | Stenz | ............. | G01R 31/318522 |
| 10,452,797 B2 * | 10/2019 | Smith | ..................... | G06F 30/33 |
| 10,452,801 B2 * | 10/2019 | Beck | .................... | G06F 30/392 |
| 10,534,878 B1 * | 1/2020 | Bai | ...................... | G06F 30/3312 |
| 10,831,971 B1 * | 11/2020 | Quay | .................... | G06F 30/337 |
| 11,861,281 B2 * | 1/2024 | Lee | ........................ | G06F 30/394 |
| 2005/0151258 A1 * | 7/2005 | Kotecha | ................ | G06F 30/394 257/758 |

(Continued)

*Primary Examiner* — Nha T Nguyen
(74) *Attorney, Agent, or Firm* — Andrew L. Dunlap; Haynes Beffel & Wolfeld LLP

(57) ABSTRACT

A method of performing an optimization within a circuit layout design is provided. The method includes determining, from multiple nets of the circuit layout design, a target net that has one or more performance characteristics that are outside a range of constraints, determining, from the multiple nets, a non-critical net that has the one or more performance characteristics that are within the range of the constraints, and adjusting, by a processor, one or more of a shape and a location of one or more of the non-critical net and the target net, such that the one or more performance characteristics of the non-critical net is changed and remains within the range of the constraints.

20 Claims, 8 Drawing Sheets

(56) References Cited

U.S. PATENT DOCUMENTS

| | | | |
|---|---|---|---|
| 2006/0026546 A1* | 2/2006 | Dinter | G06F 30/00 |
| | | | 716/113 |
| 2006/0277512 A1* | 12/2006 | Kucukcakar | G06F 30/39 |
| | | | 716/112 |
| 2008/0077900 A1* | 3/2008 | Oh | G06F 30/33 |
| | | | 716/122 |
| 2009/0037854 A1* | 2/2009 | Bittlestone | G06F 30/327 |
| | | | 716/139 |
| 2009/0070715 A1* | 3/2009 | Curtin | G06F 30/30 |
| | | | 716/132 |
| 2010/0257498 A1* | 10/2010 | Alpert | G06F 30/327 |
| | | | 716/113 |
| 2010/0262939 A1* | 10/2010 | Zahn | G06F 30/3312 |
| | | | 716/132 |
| 2011/0302546 A1* | 12/2011 | Mottaez | G06F 30/30 |
| | | | 716/132 |
| 2012/0124537 A1* | 5/2012 | Daede | G06F 30/3312 |
| | | | 716/113 |
| 2012/0284683 A1* | 11/2012 | Alpert | G06F 30/3947 |
| | | | 716/129 |
| 2015/0269304 A1* | 9/2015 | Zahn | G06F 30/398 |
| | | | 716/113 |
| 2016/0012172 A1* | 1/2016 | Folberth | G06F 30/394 |
| | | | 716/113 |
| 2016/0283638 A1* | 9/2016 | Folberth | G06F 30/394 |
| 2017/0206286 A1* | 7/2017 | Lee | G06F 30/394 |
| 2017/0212977 A1* | 7/2017 | Bickford | G06F 30/394 |
| 2017/0293708 A1* | 10/2017 | Geist | G06F 30/394 |
| 2019/0065656 A1* | 2/2019 | Chakraborty | G06F 30/3947 |
| 2020/0050730 A1* | 2/2020 | Daellenbach | G06F 30/394 |

\* cited by examiner

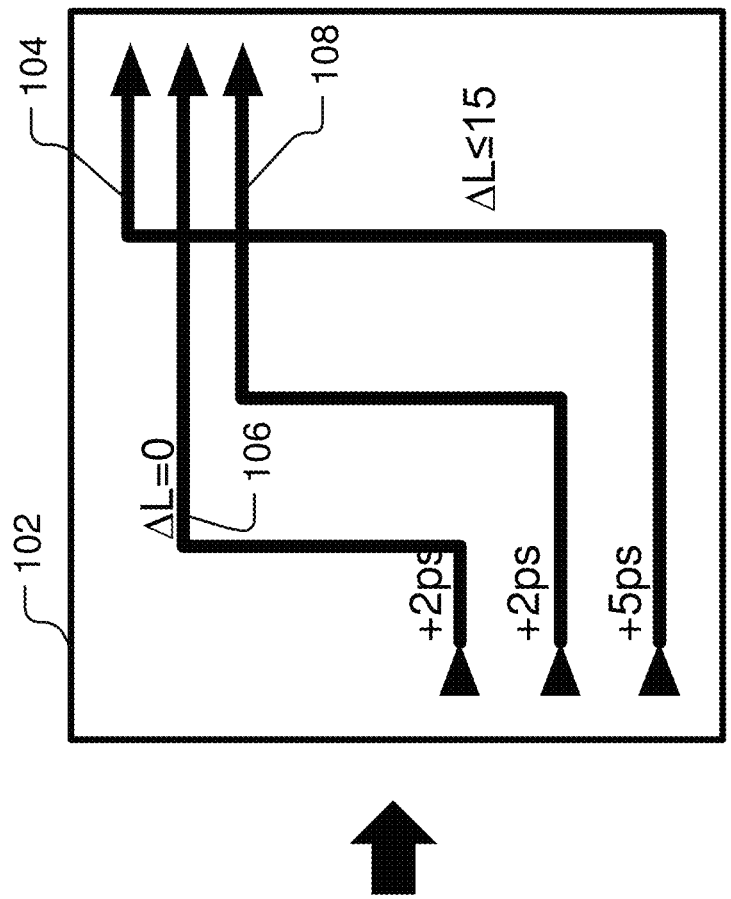
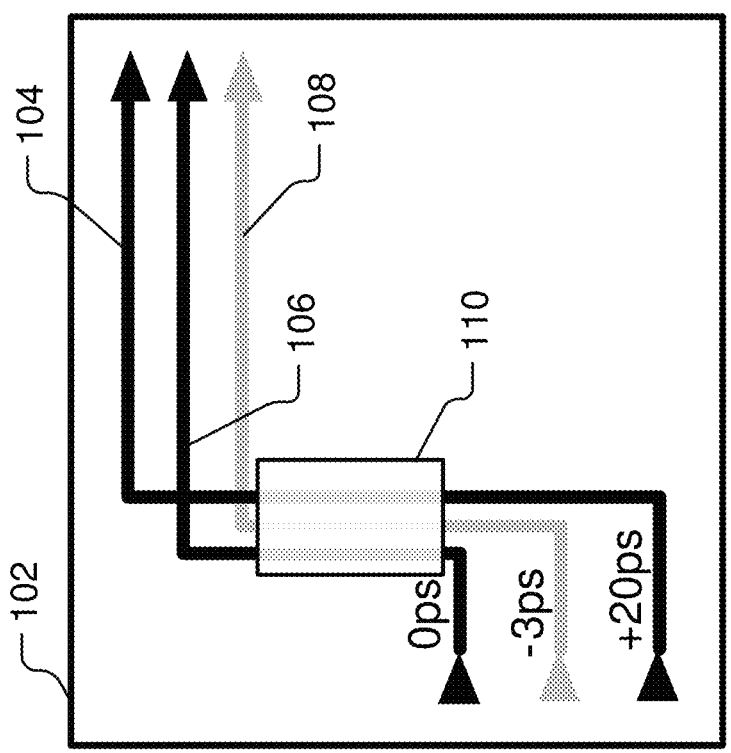

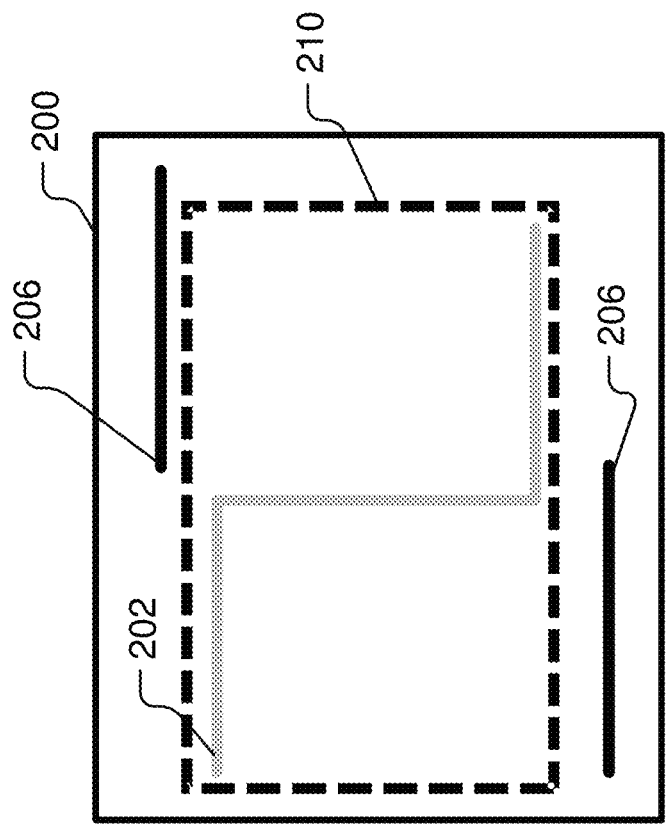
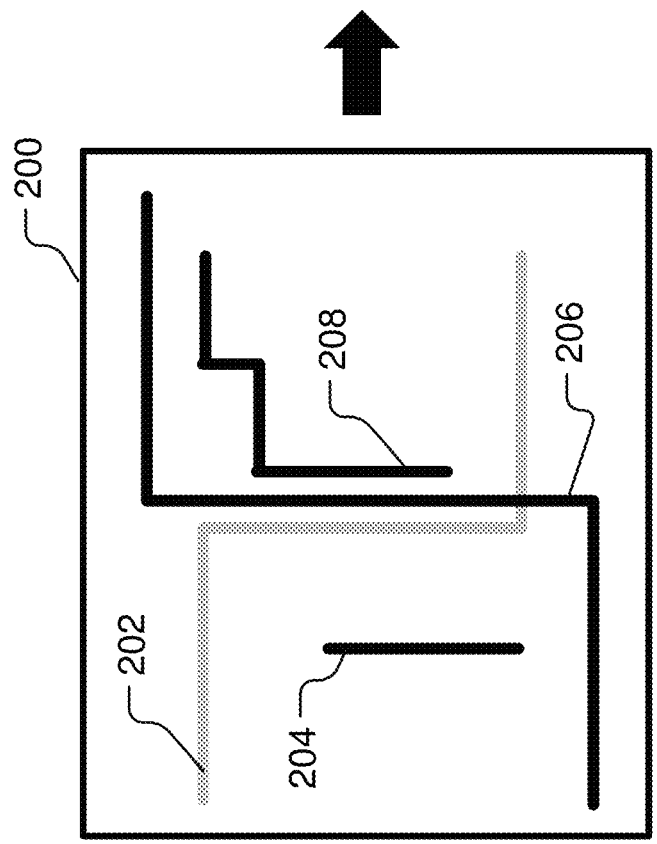
FIG. 2A
FIG. 2B

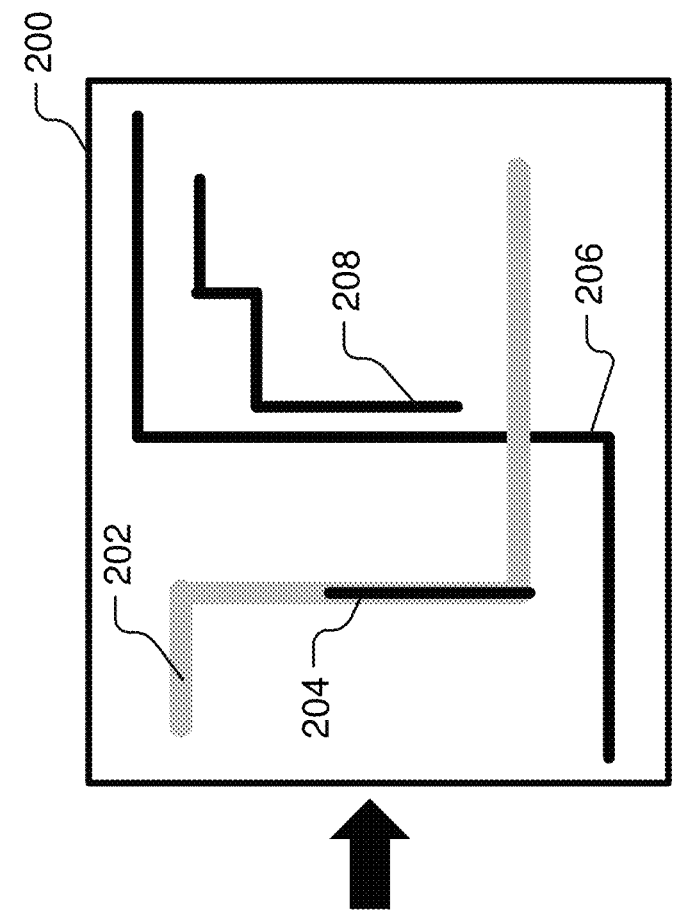
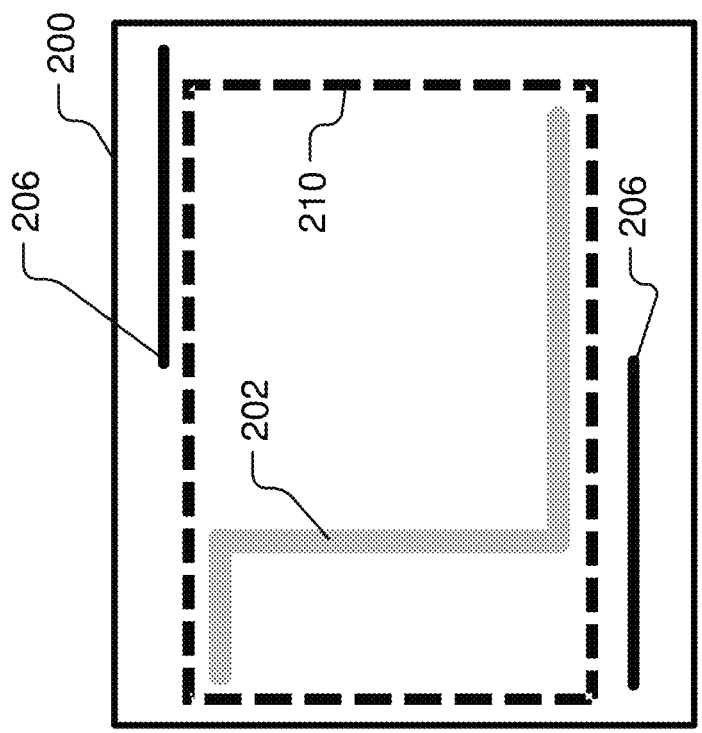
FIG. 2D
FIG. 2C

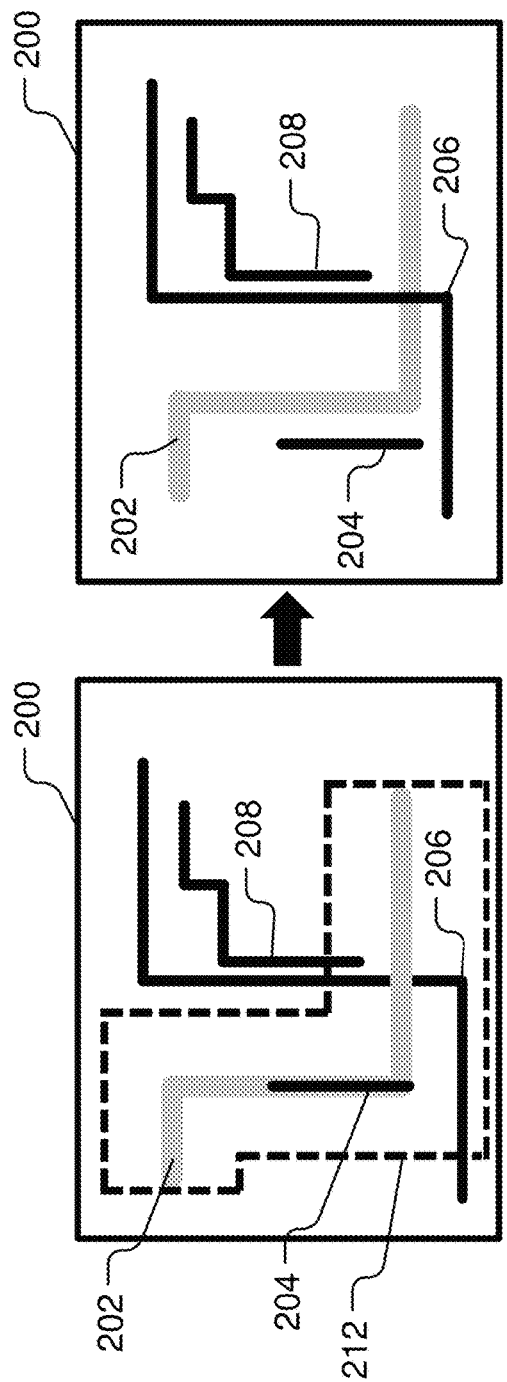
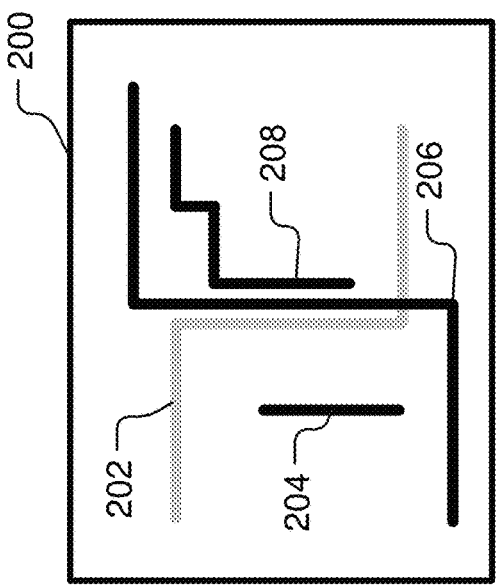

| Design | # Nets | # Target Nets | Runtime (min) | rDRV | | WNS | | TNS 100 | |
|---|---|---|---|---|---|---|---|---|---|
| | | | | Ref. | Δ | Ref. | Δ% | Ref. | Δ% |
| 1 | 73k | 127 | 36.2 | 93 | -30 | -124.196 | -10% | -8343.29 | -7% |
| 2 | 176k | 68 | 25.7 | 79 | 13 | -0.167 | -1% | -14.233 | 0% |
| 3 | 179k | 49 | 21.2 | 8 | -6 | -0.232 | 0% | -24.776 | 0% |
| 4 | 436k | 9 | 27.6 | 9798 | -2202 | -0.283 | 0% | -17.971 | 2% |
| 5 | 353k | 71 | 31 | 18 | 24 | -101.672 | 0% | -7407.67 | 0% |
| 6 | 396k | 132 | 33.2 | 304 | 15 | -0.194 | 0% | -22.46 | 0% |
| 7 | 360k | 32 | 41.3 | 19 | -4 | -0.124 | -1% | -12.078 | 0% |
| 8 | 340k | 55 | 72.7 | 3657 | -1141 | -0.044 | -27% | -2.137 | 15% |
| 9 | 1.06M | 45 | 50.4 | 15325 | -1861 | -5.668 | -21% | -1763.87 | -40% |
| 10 | 1.57M | 31 | 50.7 | 1080 | -584 | -0.939 | -5% | -17.751 | -1% |
| 11 | 856k | 58 | 144.2 | 1376 | -584 | -0.181 | -29% | -18.818 | 0% |
| 12 | 2.93M | 41 | 276.7 | 20802 | -2590 | -0.561 | 0% | -29.993 | 0% |

FIG. 3

TIMING-AWARE SURGICAL OPTIMIZATION FOR ENGINEERING CHANGE ORDER IN CHIP DESIGN

CROSS REFERENCE TO RELATED APPLICATIONS

This application claims priority under 35 U.S.C. § 119 (e) to U.S. Provisional Application No. 63/121,853 filed Dec. 4, 2020, entitled "Signoff Timing-Aware Surgical Wire Optimization for Engineering Change Orders", the entire contents of which is hereby incorporated by reference in its entirety.

TECHNICAL FIELD

The present disclosure generally relates to an electronic design automation (EDA) system. In particular, the present disclosure relates to a system and method for performing timing-aware surgical optimizations for engineering change order (ECO) routing in chip design.

BACKGROUND

At the signoff stage in chip (e.g., circuit layout) design, an engineering change order (ECO) is the last step that allows the final logical and physical changes to be implemented in order to finalize the design specification of the chip. The signoff stage is the last design stage before tape-out and fabrication. The ECO identifies the final logical and physical changes to be implemented for better Quality of Result (QOR) before the chip design is finalized. Due to the significance of the ECO phase, robust and conservative methods have been employed as signoff ECO techniques for design optimization.

SUMMARY

In an embodiment, the present disclosure includes a method of performing an optimization in a circuit layout design. The method can include determining, from multiple nets with the circuit layout design, a target net that has one or more performance characteristics that are outside a range of constraints, determining, from the multiple nets, a non-critical net that has the one or more performance characteristics that are within the range of the constraints, and adjusting, by a processor, one or more of a shape and a location of one or more of the non-critical net and the target net, such that the one or more performance characteristics of the non-critical net is changed and remains within the range of the constraints.

In an embodiment, the one or more of the shape and the location of the one or more of the non-critical net and the target net can be adjusted in dependence on one or more of (a) routing constraints including net-level non-default routing rules and (b) shape-level controls In another embodiment, the one or more performance characteristics of the target net can change as a result of the adjusting of the non-critical net, such that the one or more performance characteristics of the target net are within the range of the predefined constraints.

In a further embodiment, wherein the adjusting can further include adjusting both (i) the non-critical net, such that the one or more performance characteristics of the non-critical net is changed and remains within the range of the constraints and (ii) the target net.

In an embodiment, the adjusting of the target net can include rerouting the target net.

In a further embodiment, the adjusting can include adjusting the location of one or more of the non-critical net and the garget net based on one or more of (i) changing a layer of the one or more of the non-critical net and the target net (ii) changing a spacing of the one or more of the non-critical net and the target net with respect to other nets.

In an embodiment, the adjusting can include adjusting the shape of one or more of the non-critical net and the target net based on changing a width of the one or more of the non-critical net and the target net.

In another embodiment, the method can further include determining that the adjusted target net has a negative impact on the one or more performance characteristics of the multiple nets, such that the one or more performance characteristics of a net of the multiple nets has changed from being within the range of the constraints to being outside the range of the constraints, and reverting the adjusted target net to the original target net based on the determination that the adjusted target net has the negative impact on the one or more performance characteristics of the multiple nets.

In an embodiment the adjusting of the non-critical net can include rerouting the non-critical net.

In another embodiment, the method can further include determining that the adjusted non-critical net has a negative impact on the one or more performance characteristics of the multiple nets, such that the one or more performance characteristics of a net of the multiple nets has changed from being within the range of the constraints to being outside the range of the constraints, and reverting the adjusted non-critical net to the original non-critical net in based on the determination that the adjusted non-critical net has the negative impact on the one or more performance characteristics of the multiple nets.

In an embodiment, the one or more performance characteristics can include delay characteristics, identified as slack, and the target net can be determined as having the slack that is outside the range of the constraints.

In a further embodiment, the determined non-critical net can be determined, from the multiple nets, as a net having all performance characteristics that are within the range of the constraints.

In another embodiment the one or more performance characteristics can include delay characteristics, identified as slack, and the non-critical net can be determined as having slack that is within the range of the constraints.

In an embodiment the slack can be a positive slack that is within the range of the constraints.

In a further embodiment, the one or more performance characteristics can include delay characteristics, identified as slack, the non-critical net can be determined as having a positive slack, the adjusting of the non-critical net can include rerouting the non-critical net, such that the positive slack is reduced and yet remains within the range of the constraints, the target net can be determined as having a negative slack, the adjusting of the target net can include rerouting the target net, and, as a result of the rerouting of the non-critical net and the target net, the target net can have a positive slack.

In an embodiment the adjusting of the target net can include forming a first bounding box to surround the target net, removing all determined non-critical nets that are within the first bounding box, adjusting the target net by performing at least one or more of a layer change, a spacing change, a width change, and a rerouting change to the target net, and restoring all of the removed non-critical nets.

In another embodiment the adjusting of the target net and the adjusting of the non-critical net can include determining, from the multiple nets, a neighboring net having the one or more performance characteristics decreased by the adjusting of the target net, forming a second bounding box to surround the adjusted target net and at least a portion of the neighboring net, and rerouting the determined neighboring net that is within the second bounding box based on (i) the routing constraints including the net-level non-default routing rules and (ii) the shape-level controls.

In a further embodiment the method can further include determining whether the adjusted non-critical net, the adjusted target net and the rerouted neighboring net satisfy acceptance criteria including one or more of a number of shapes and vias, a final route length, a resistance, a capacitance, and an effective coupling length between nets, in dependence upon a determination that one of the adjusted non-critical net, the adjusted target net and the rerouted neighboring net does not satisfy the acceptance criteria, automatically applying a different adjustment to the one of the adjusted non-critical net, the adjusted target net and the rerouted neighboring net, and in dependence upon a determination that the adjusted non-critical net, the adjusted target net and the rerouted neighboring net satisfy the acceptance criteria, adopting the adjusted non-critical net, the adjusted target net and the rerouted neighboring net.

In another embodiment, the adjusting selects a desired adjustment scenario from multiple adjustment scenarios that results in a desired distribution of performance characteristics across the non-critical net and the target net.

In an embodiment, the present disclosure includes a system, wherein the system includes a memory storing instructions, and a processor, coupled with the memory and to execute the instructions. The instructions when executed can cause the processor to perform operations including determining, from multiple nets with the circuit layout design, a target net that has one or more performance characteristics that are outside a range of constraints, determining, from the multiple nets, a non-critical net that has the one or more performance characteristics that are within the range of the constraints, and adjusting, by a processor, one or more of a shape and a location of one or more of the non-critical net and the target net, such that the one or more performance characteristics of the non-critical net is changed and remains within the range of the constraints.

In a further embodiment, the present disclosure includes a non-transitory computer readable medium having stored instructions. When the stored instructions are executed by a processor, they can cause the processor to perform operations including determining, from multiple nets with the circuit layout design, a target net that has one or more performance characteristics that are outside a range of constraints, determining, from the multiple nets, a non-critical net that has the one or more performance characteristics that are within the range of the constraints, and adjusting, by a processor, one or more of a shape and a location of one or more of the non-critical net and the target net, such that the one or more performance characteristics of the non-critical net is changed and remains within the range of the constraints.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 1A illustrates an example diagram of a circuit layout design, according to an embodiment of the present disclosure.

FIG. 1B illustrates an example diagram of a circuit layout design from FIG. 1A after optimizing a portion of the circuit layout design, according to an embodiment of the present disclosure.

FIG. 2A illustrates an example diagram of another circuit layout design, according to an embodiment of the present disclosure.

FIG. 2B illustrates an example diagram for performing optimization of the circuit layout design from FIG. 2A, according to an embodiment of the present disclosure.

FIG. 2C illustrates an example diagram for performing optimization of the circuit layout design from FIG. 2B, according to an embodiment of the present disclosure.

FIG. 2D illustrates an example diagram for performing optimization of the circuit layout design from FIG. 2C, according to an embodiment of the present disclosure, FIG. 2E illustrates an example diagram performing optimization of the circuit layout design from FIG. 2D, according to an embodiment of the present disclosure.

FIG. 2F illustrates an example diagram performing optimization of the circuit layout design from FIG. 2E, according to an embodiment of the present disclosure.

FIG. 2G illustrates an example diagram performing optimization of the circuit layout design from FIG. 2F, according to an embodiment of the present disclosure.

FIG. 3 illustrates various quality of results benefits based on the present system and method, according to an embodiment of the present disclosure.

DETAILED DESCRIPTION

Figure 4:
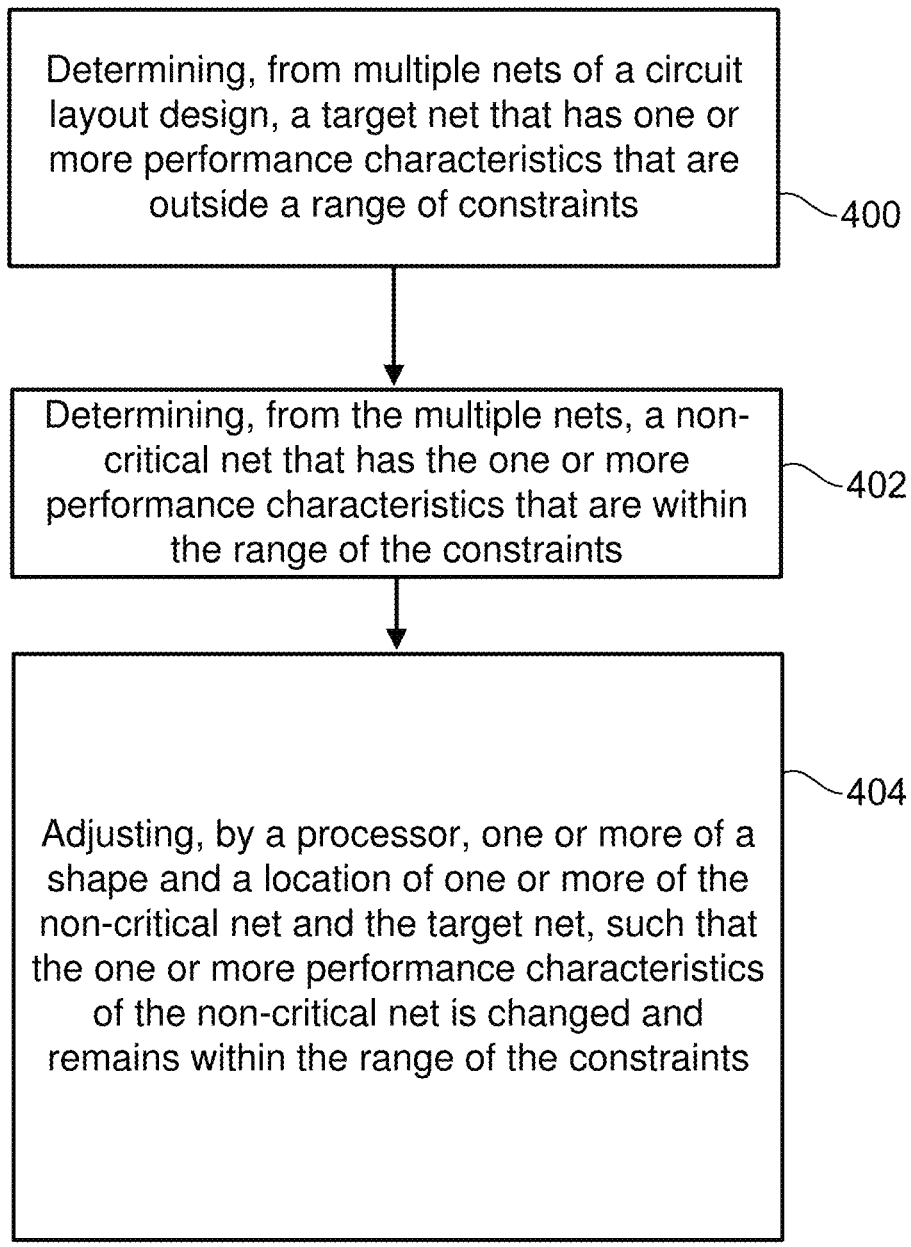
FIG. 4 illustrates a flowchart describing operations for performing optimization in a circuit layout design, according to an embodiment of the present disclosure.

Aspects of the present disclosure relate to signoff timing-aware surgical optimization for engineering change orders (ECOs) in chip (e.g., circuit layout) design.

In very large-scale integration (VLSI) of chip design, each timing path of the chip includes an alternative series of functional cells (logic gates) and routing nets (metal wires and vias) where the functional cells and routing nets (also referred to as nets) have a certain timing delays when an electric signal to travels from a starting point to an ending point (or from one midpoint to another midpoint).

If the total delay along the timing path (or the net of the timing path) is not within a given range of a constraint (e.g., a timing constraint), then that timing path (or net) is a timing critical path. In other words, the timing path is a timing critical path because the delay is outside a predetermined range. A buffer is a delay gate that does not change the functionality of a timing path. The size of a buffer can be changed (i.e., buffer sizing) or buffers can be added to or removed from a timing path to adjust the delay of the timing path. As a result, the total delay of the timing path can be optimized using buffers to meet the given constraint. A result of applying various cell optimization techniques, including but not limited to the above-described buffering, is that the routing nets (or just nets) may include open or short circuits, which change the intended logical functionality of the chip.

To account for the delays, ECO routing can be performed to ensure that the open circuit and short circuit violations do not happen. For example, when an open circuit is formed in the chip, ECO routing (performed by an ECO router) can be referred to as open-patching after cell modification because the ECO router patches open circuits. An ECO router can include a processor that performs stored instructions for performing the ECO routing. This usage of the ECO router as an open-patcher can cause other issues. For example, the ECO router can introduce unexpected overhead due to routability issues, delays and noise (e.g., cross-talk and delays caused by cross talk). The delays can become more pronounced between long parallel route shapes. When these issues take place, they negatively impact the final quality of results (QOR) of the chip design.

Furthermore, when using the ECO router as a standalone solution for ECO optimization, information available to the ECO router about fine-grain slack (e.g., timing delays) and noise (e.g., cross-talk) is limited, because the ECO router may only be implemented to perform optimizations based on few dominant scenarios out of more than hundreds or thousands of given scenarios (e.g., all given process, voltage, temperature, etc. scenarios) to reduce the total runtime overhead.

Therefore, a need arises for improved techniques for optimizing chip design to handle net and shape changes (i.e., changes to nets or routing nets of the chip) that result from ECOs. The present system and method disclosed, in conjunction with the ECO router, implements a signoff timer to accurately identify performance characteristics, such as delay (e.g., slack) and noise (e.g., cross-talk or cross-talk delay) considering all given process, voltage, temperature scenarios. Target nets (also referred to as critical nets) found by the ECO router, may not be equivalent to target nets (or critical nets) reported by the signoff timer. Using the signoff timer to help determine (or identify) target nets, as well as non-critical nets, provides more accurate results than just relying on the ECO router. Furthermore, the present system and method can minimize perturbation on timing QOR using surgical router controls.

Specifically, the present system and method disclosed allows the signoff timer to provide optimal fine-grained route constraints and guidance for ECO routing. The net-level, non-default routing (NDR) rules can be optimized based on both ECO routing and signoff timing contexts. While net-level routing constraints can apply to entire net shapes (e.g., wires and vias), the present system and method disclosed can specifically optimize each metal shape and via, which is defined as shape-level route constraints. For example, the amount of detouring and unlocking of shapes can be proportional to the slack margin that is available while still meeting timing constraints, as determined by the signoff timer. The present system and method disclosed allows the routing of non-timing-critical nets (e.g., routing nets that have a delay that is within a range of constraints) to be surgically (e.g., adjusted at a very fine level of detail, as described throughout this document) degraded to improve the routing and performance characteristics of target nets (e.g., routing nets that have a delay that is outside the range of constraints). A routing net can be surgically degraded by, for example, locally changing (rerouting) a path (e.g., shape) of the routing net without introducing undesirable perturbation. If the optimization (e.g., rerouting) turns out to be a negative change, such that other nets have delays and/or cross-talk that is outside the range of constraints as a result of the optimization, then the present system and method implements an automatic undo feature to mitigate or remove the negative impact on QOR or routability.

Technical advantages of the present system and method include the ability to (i) analyze millions of nets of a circuit design to determine (or identify) hundreds of target nets and non-critical nets for optimization and (ii) test various optimizations of the determined (or identified) nets to improve the performance of the circuit design in several hours or less.

In one embodiment, the present system and method disclosed has achieved a reduction of noise violations by 36%, a reduction of total negative slack (TNS) by 8% and a reduction of the worst negative slack (WNS) by 45%. Slack is the difference between the delay and the given timing constraint (requirement) of a timing path in VLSI. Negative slack means that the path has not achieved the specified timing constraints and/or the specified frequency as a result of noise. As the delay becomes worse, the more negative the slack becomes. Total negative slack is the sum of all negative slacks within a chip or within a region of the chip.

The present system and method enables tight coupling between the ECO router and the signoff timer. Similar to the ECO router, the signoff timer can include a processor that executes instructions to perform a series of signoff/verification steps. In electronic design automation (EDA), a signoff step is a series of verification steps that the design must pass before it can be sent to a fabrication facility (i.e., taped out). A signoff timer verifies whether the chip meets the desired performance characteristics at all considerable process, voltage, temperature scenarios. The signoff timer also determines the timing criticality of a net (e.g., is the net a target net or a non-critical net) by analyzing timing paths. After the signoff timer determines the timing criticality accurately, and the present system and method surgically degrades the ECO routing of non-critical nets (e.g., non-timing critical nets) around one or more timing-critical nets (of a net-list) within the allowed timing margin. In other words, this extra time margin (e.g., a positive slack in a timing path) can be utilized by degrading the routing path of the non-timing-critical nets. A net (or routing path of a net) is degraded when the rerouting of the net has a negative impact on performance characteristics of the net, such as introducing a delay and/or noise into the net. As a result, the present system and method improves the routing of the target nets (also referred to as timing-critical nets) based on the additional routing resources and spaces gained from degrading the performance characteristics (e.g., the delay and/or noise) of the non-critical nets.

FIGS. 1A and 1B illustrate example diagrams for performing optimization of a portion of a chip layout design, according to an embodiment of the present disclosure.

Specifically, as illustrated in FIG. 1A, a portion 102 of a chip is illustrated. The portion 102 includes three routing nets 104, 106 and 108, hereinafter simply referred to as nets 104, 106 and 108. Nets 104, 106 and 108 are on different (metal) layers of the chip layout design, so as to prevent a short. A signoff timer can perform analysis to determine which of the nets 104, 106 and 108 (if any) is a target net (e.g., a timing-critical net) and which of the nets 104, 106, 108 (if any) is a non-critical net (e.g., a non-timing critical net).

With respect to performance characteristics, there can be several different types of slack measurements with respect to delay (or non-delay) of a signal traveling along a net. The different types of slack measurements can include: (i) positive setup slack, in which the signal traveling along the net is ahead of schedule, (ii) negative setup slack, in which the signal traveling along the net is slower than desired, (iii) positive hold slack, in which the signal traveling along the net arrived later than required, (iv) negative hold slack, in which the signal traveling along the net arrived earlier than required, (v) a setup slack of 0 if the signal traveling along the net is right on schedule, and (vi) a hold slack of 0 if the signal traveling along the net arrives right on time then there is a hold slack of 0.

In FIG. 1A, net 106 has a setup slack of 0 picoseconds (ps), net 108 has a setup slack of −3 ps (also referred to as negative setup slack of 3 ps) and net 104 has a setup slack of +20 ps (also referred to as positive setup slack of 20 ps). Negative setup slack is not desirable, as it means that the signal traveling along the net is slower than desired. Positive setup slack is desirable, as it means that the signal traveling along the net is ahead of schedule. Each chip design can have multiple sets (e.g., ranges) of constraints (e.g., predefined constraints) that are acceptable including hold slack, minimum transition time, crosstalk, power IR (current-resistance) drop, clock skew, clock slew, etc.

The present system and method disclosed determines (or identifies) a target net as a net that has performance characteristics outside of the range of constraints (e.g., predefined constraints) as well as a non-critical net that has some or all performance characteristics within the range of constraints. For example, the range (or set) of constraints (e.g., predefined constraints) for the portion 102 of the chip can include a setup slack of 0 ps for net 106, a setup slack of 0 ps for net 108 and a setup slack of 0 ps for net 104. Here, the performance characteristic by which nets 104, 106 and 108 are measured is setup slack. In this example, the signoff timer will determine (or identify) net 108 as a target net because the −3 ps setup slack is outside of the range of performance characteristics and it will determine (or identify) nets 104 and 106 as non-critical nets because their respective setup slack of 0 ps and positive setup slack of +20 ps are within the range of performance characteristics. Other portions of the chip may have different ranges of performance characteristics and different types of nets can have different ranges of performance characteristics. The ranges of performance characteristics can be set by a user or by the present system (e.g., by using default values). In addition to the types of slack described above, performance characteristics can include frequency, noise, transition time (e.g., the time taken by signal to rise from a certain level (percentage) of its maximum level to another level (percentage) of its maximum value.), etc.

In view of the net 108 being determine (or identified) as a target net 108 within the portion 102 of the chip, the present system can determine (or identify) a region 110 of the chip that is the source of the delay. For example, region 110 can be defined as being the source of cross-talk because nets 104, 106 and 108 within a certain proximity to each other within region 110 and because they travel along parallel paths. The region 110 can be identified using many forms of criteria, such as (i) proximity of nets to one another on a same layer, where proximity can be variably limited or defined based on a width of the shape at a given portion of the net and (ii) proximity above or below one another on different layers. This cross-talk between nets 104, 106 and 108 is what causes the negative setup slack of net 108 to be outside of a desired range. The present system and method disclosed can create more room for the target net 108 by restrictively moving the non-critical nets 104 and 106 to reduce the amount of cross-talk. The moving of the non-critical nets 104 and 106 is restricted based on criteria including, but not limited to, (i) total resistance of the net or nets, (ii) total capacitance of the net or nets, (iii) total length of the net or nets, (iv) total number of shapes if the net or nets, and (v) other types of overhead, such as the delta L calculation, as described below. The present system and method can perform timing analysis across some or all different optimization (e.g., rerouting) scenarios to identify an optimization (e.g., rerouting) scenario that results in the performance characteristics (e.g., delay) of the target net 108 and the non-critical nets 104 and 106 being within the range of the constraints. The present system and method disclosed can identify multiple desired optimization scenarios that result in the target net 108 and the non-critical nets 104 and 106 having performance characteristics within the range. When this happens, the present system and method disclosed can select which of the desired optimization scenarios results in the best/desired distribution of performance characteristics across the nets 104, 106 and 108 and that remain within the range of the constraints. A best/desired distribution of performance characteristics can be based on (i) maximum timing benefits (e.g., how much total negative slack can be improved, how many timing violations can be removed, etc.) and/or (ii) minimum routing changes for less disturbance.

After determining (or identifying) the target net 108 and the non-critical nets 104 and 106, as illustrated in FIG. 1A, the present system and method disclosed performs the optimization (e.g., rerouting) of some or all of the nets 104, 106 and 108, as illustrated in FIG. 1B. The optimization of some or all of the nets 104, 106 and 108 can also be referred to as adjusting the some or all of the nets 104, 106 and 108.

Specifically, FIG. 1B illustrates that the optimization (i.e., adjustment) includes the rerouting of target net 108 and non-critical net 104 to provide additional space between the non-critical net 106 and target net 108 and to provide additional space between the target net 108 and the non-critical net 104. As a result of the rerouting, the cross-talk is reduced or eliminated in the region 110. Specifically, as illustrated in FIG. 1B, the non-timing critical net 104 has been rerouted to shift the vertical portion of the non-timing critical net 104 to the right (and to adjust the lengths of the horizontal portions thereof, such that the length of the upper horizontal portion of the non-timing critical net 104 is shortened and such that length of the lower horizontal portion of the non-timing critical net 104 increased), such that the delta L is 15 or less. Delta L can have a unit length in micrometers, but it can be some other unit measurement.

Delta L is a routing constraint. Having a delta L of 15 or less means that the shape of the non-timing critical net 104 has changed such that the added overhead is 15 or less. This overhead can be a predetermined rule for rerouting nets. The value of delta L can equal, for example, a constant C times an amount of slack margin (e.g., 20 picoseconds (ps)), where the constant C is a signal propagation length per ps and is dependent upon a type of node that is being used (e.g., 7 nanometers (nm), 5 nm) due to different layer resistance and capacitance parasitics. An example calculation of the constant C includes obtaining a resistance per unit length value (Ru), obtaining a delay per resistance value (Dr) from a design metric and determining that C equals Ru/Dr. Other methods of calculating C will be apparent to a person of ordinary skill in the art. Further, other routing constraints will be apparent to a person skilled in the art.

Further, as illustrated in FIG. 1B, the target net 108 has also been rerouted, such that the vertical portion of the target net 108 has been shifted to the right and the lengths of the horizontal portions thereof are adjusted, such that the length of the upper horizontal portion of the target net 104 is shortened and the length of the lower horizontal portion of the target net 104 is increased. The delta L of the target net 108 is 15 or less, thus satisfying the predetermined rule for rerouting nets. The non-critical net 106 is not rerouted, such that the delta L of the non-critical net 106 is 0. The non-default routing (NDR) rules can be used to identify the maximum delta L (e.g., 15 in this example) as well as shape controls (e.g., layer changing, space changing, width changing, detour removal etc.) that can be applied to each net 104, 106 and 108. The result of rerouting the non-critical net 104 and the target net 108 results in the target net 108 having a positive setup slack of +2 ps, the non-critical net 104 having a positive setup slack of +5 ps and the non-critical net 106 having a positive setup slack of +2 ps. Even though the positive setup slack of non-critical net 104 has been reduced from +20 ps to +5 ps, the +5 ps is, in this example, within the desired range.

FIGS. 2A-2G illustrate example diagrams for performing optimization on a portion of another chip layout design, according to an embodiment of the present disclosure.

Specifically, FIG. 2A illustrates a portion 200 of a chip that includes nets 202, 204, 206 and 208. Nets 202, 204, 206 and 208 can be wires and vias or they can be other types of routing nets and nets 202, 204, 206 and 208 can be on different (metal) layers. Referring to FIG. 2A, net 202 has been determined (or identified) by a signoff timer and/or ECO router as being a target net that needs optimization in a similar manner as described above with respect to FIG. 1A. Specifically, the target net 202 is determined (or identified) by the signoff timer and/or ECO router based on its performance characteristics including timing information (e.g., negative slack). The present system and method disclosed further determines (or identifies) nets 204, 206 and 208 as non-critical nets, as they have performance characteristics that are within the range of the predefined constraints. The present system and method disclosed further determines net and shape-level ECO routing constraints that can be applied to the target net 202. For example, the ECO routing constraints can set the limit of delta L for rerouting target net 202 and it can also limit shape changes including, but not limited to, setting a limit for the amount of layer change (e.g., layer promotion to a higher layer or layer demotion to a lower layer), an amount of space change, and an amount of width change. Other characteristics regarding the changing of the target net 202 can be limited by the ECO routing constraints and these other characteristics will be apparent to a person skilled in the art. The present system and method disclosed can also determine (or identify) neighboring nets, such as nets 206 and 208 that are adjacent to target net 202.

FIG. 2B illustrates applying a bounding box 210 to surround/cover the entire target net 202. FIG. 2B also illustrates removing the non-critical nets 204 and 208 and portions of non-critical net 206 that are within the bounding box 210. In this example, the vertical portion of non-critical net 206 is removed. Vias can also be removed if they are within the bounding box 210. By removing the non-critical nets 204 and 208 and by removing the portion of non-critical net 206 an unoccupied space is created within the bounding box 210, except that the target net 202 remains. In an implementation, if there are other target nets (e.g., timing-critical shapes or vias) in the bounding box, then they can be left to remain. In other words, for the rerouting or optimization of the target net 202, the present system and method disclosed removes all non-critical nets including wire shapes and vias that are located within the bounding box 210, so as to preserve the unoccupied space for an optimal result when rerouting or optimizing the target net 202 as well as other nets.

FIG. 2C illustrates the ECO router applying the ECO routing constraints to the target net 202 to reduce or eliminate the negative slack and/or cross-talk. For example, in FIG. 2C, the vertical portion of the target net 202 is shifted to the left and the lengths of the horizontal portions of the target net 202 are adjusted accordingly. Further, in FIG. 2C the ECO router adjusts the width of the entire target net 202. The ECO router can also apply a layer change (e.g., promotion or demotion, not illustrated) to the target net 202. In this example, the target net 202 is promoted by a layer (not illustrated in FIG. 2C, but illustrated in FIG. 2D in which the target net 202 is above the non-critical net 206). Further, in this example, the width of the target net 202 is doubled (2X). The width of the target net 202 can be more than doubled, as this doubled width is just an example. The shifting of the vertical portion of the target net 202 can be intentional, or it can be an unintentional byproduct of some other shape change control. In addition to the shifting and the widening, the ECO router can apply additional spacing, shielding and/or tapering to the target net 202.

FIG. 2D illustrates restoring the non-critical nets 204 and 208 (to the portion 200 of the chip) that were fully removed in FIG. 2B and also illustrates restoring the vertical portion of the non-critical net 206. As illustrated in FIG. 2D, some of the neighboring non-critical nets 204, 206 and 208 that were restored are now in the way of (overlying or underlying) the rerouted and widened target net 202. Specifically, as illustrated, non-critical net 204 is in the way of (e.g., short circuited or directly above in a higher or lower layer) the rerouted and widened target net 202. Because the non-critical net 204 is in the way of the target net 202, additional optimization can be carried out.

FIG. 2E illustrates determining (or identifying) neighboring nets affected by the rerouting of the target net 202. Specifically, when the removed nets 204, 206 and 208 are restored, a problem can arise as a result of the restored nets (i.e., net 204) underlying or overlying the adjusted target net 202. Further, other neighboring nets, such as non-critical nets 206 and 208 can be affected by having a close proximity to the adjusted target net 202. FIG. 2E determines (or identifies) a critical area 212 (e.g., a bounding box) surrounding the adjusted (rerouted) target net 202. The size and location of the critical area 212 can be determined using several methods. The distance of the boundary of the critical area 212 from the widened target net 202 may be determined based on a multiple of the pitch of the widened target net 202. In one example, the size and location of the critical area 212 is defined by taking 5 times the pitch of the widened target net 202 to essentially determine the boundary of the critical area 212. Other numbers can be used, such as 3 times the pitch, 4 times the pitch, and 6 times the pitch. Other methods for defining the location and size of the critical area 212 will be apparent to a person skilled in the art.

FIG. 2F illustrates at attempt to reroute neighboring nets, that are within the critical area 212, with net and shape-level ECO routing constraints. As illustrated in FIG. 2F, the non-critical net 204 is shifted to the left so that is no longer underlying or overlying the adjusted target net 202 and the non-critical net 206 is promoted to a different layer so that it overlies the adjusted target net 202. As discussed above, the ECO router can move the neighboring non-critical nets 204 and 206 within constraints (e.g., delta L) identified by the signoff timer. In this example, the signoff timer provides guidance regarding the leftward movement of the non-critical net 204 and the layer promotion of the non-critical net 206, all while satisfying the constraints.

FIG. 2G illustrates adopting only changes that are within, for example net and shape-level ECO routing constraints (e.g., total number of shapes and vias, total final route length, resistance, capacitance, effective coupling length, etc.), and performing final routing design rule violation (rDRV) cleanup.

In this example, the optimizing of the target net 202 and the optimizing of the neighboring non-critical nets 204 and 206 does not satisfy the constraints determined (or identified) by the signoff timer. The present system and method disclosed implements an automatic undo process that prevents optimizations such as route changes and layer changes that do not satisfy the constraints from being fully adopted. In other words, if the proposed optimization results in a worse scenario or a scenario that does not satisfy predetermined rules, then the present system and method disclosed can revert back to the original routing rules (revert back to the original target net 202 and the original non-critical nets 204 and 206) and/or attempt to implement different NDR rules. A determination can also be made as to whether the optimized nets satisfy acceptance criteria including a number of shapes and vias, a final route length, a resistance, a capacitance, and an effective coupling length. Other acceptance criteria will be apparent to a person skilled in the art. This mitigates and even overrides a negative impact on QOR or routability caused by attempted optimizations. In contrast, if the optimizations performed in FIG. 2F were to satisfy the routing rules, then the optimizations illustrated in FIG. 2F would be accepted and a final rDRV cleanup would be performed. In other words, if the end result is the routing illustrated in FIG. 2F or if the end result is the routing illustrated in FIG. 2G, then the rDRV cleanup is performed to remove remaining routing design rule violations, while minimizing the routing perturbation. In FIG. 2G the changing of the target net was not acceptable (violated the routing design rule constraints), so the present system and method disclosed reverted the target net 202 and the non-critical nets 204, 206 and 208 back to their original shapes, locations and widths.

FIG. 3 illustrates various quality of results (QOR) benefits based on the present system and method, according to an embodiment of the present disclosure.

Specifically, FIG. 3 illustrates 12 different chip designs that have been optimized using the present system and method. FIG. 3 also illustrates (i) the number of nets (#Nets) included in each chip design, (ii) the number of target nets (#Target Nets) identified in each chip design, (iii) the runtime in minutes that it took to perform the optimizations, (iv) the number of rDRVs included in each chip design (i.e., Ref.) and the number of rDRVs that changed (i.e., delta) as a result of the optimization, (v) the worst negative slack (WNS) resulting from the optimization (i.e., Ref.) and the amount (percentage) of change of the WNS (i.e., delta %) as a result of the optimization and (vi) the total negative slack of the top 100 most critical (i.e., target) nets (TNS 100) (i.e., Ref.) and the amount (percentage) of change of the TNS 100 (i.e., delta %) as a result of the optimization. For TNS 100, before optimization a signoff timer can identify 100 of the most timing critical nets in a particular design and then after optimization the signoff timer can collect the timing information of the same 100 nets to determine timing improvement metrics.

As illustrated in FIG. 3, several chip design optimizations have achieved a WNS reductions (see WNS delta % having grey highlights). Specifically, FIG. 3 illustrates that the optimization of chip design 11 has achieved a 29% WNS reduction without introducing harmful changes on routing design rule violations (e.g., there was a decrease in routing design rule violations (rDRVs)). No harmful changes are introduced on WNS and rDRVs across all designs. Additionally, the present system and method has demonstrated that signoff timer and ECO router co-optimization can improve noise violations by 36%, TNS by 8%, and WNS by 45% with real design testcases.

FIG. 4 illustrates a flowchart describing operations for performing optimization in a circuit layout design according to an embodiment of the present disclosure.

Specifically, FIG. 4 illustrates operation 400, which includes determining, from multiple nets within the circuit layout design, a target net that has one or more performance characteristics that are outside a range of constraints (e.g., predefined constraints).

Further, FIG. 4 illustrates operation 402, which includes determining, from the multiple nets, a non-critical net that has the one or more performance characteristics that are within the range of the constraints.

FIG. 4 also illustrates operation 404, which includes adjusting, by a processor, one or more of a shape and a location of one or more of the non-critical net and the target net, such that the one or more performance characteristics of the non-critical net is changed and remains within the range of the constraints.

Figure 5:
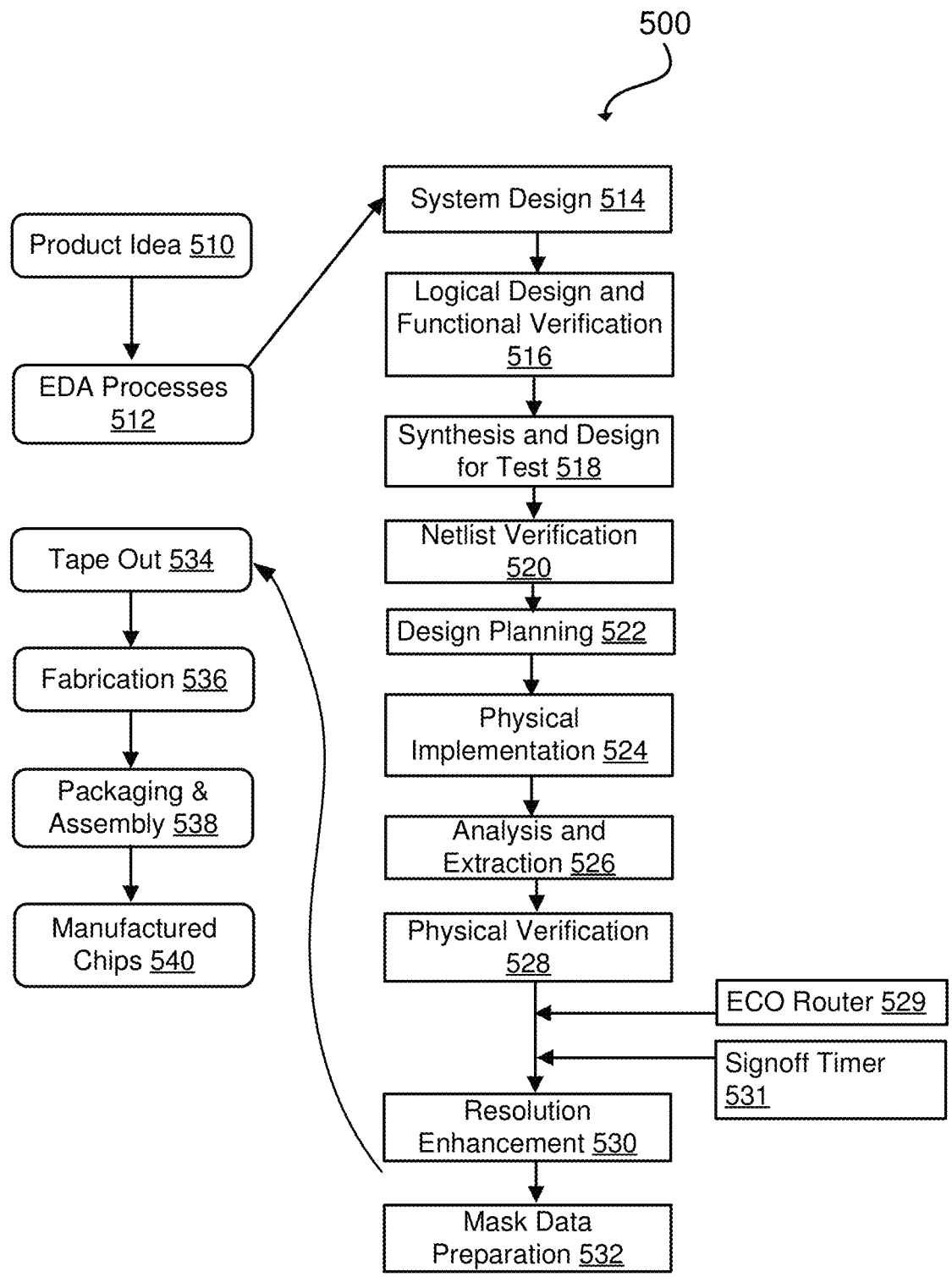
FIG. 5 depicts a flowchart of various processes used during the design and manufacture of an integrated circuit in accordance with some embodiments of the present disclosure.

FIG. 5 illustrates an example set of processes 500 used during the design and verification stages, which include ECOs, and also in the fabrication stage of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 510 with information supplied by a designer, information which is transformed to create an article of manufacture that uses a set of EDA processes 512. When the design is finalized, the design is taped-out 534, which is when artwork (e.g., geometric patterns) for the integrated circuit is sent to a fabrication facility to manufacture the mask set, which is then used to manufacture the integrated circuit. After tape-out, a semiconductor die is fabricated 536 and packaging and assembly processes 538 are performed to produce the finished integrated circuit 540.

Specifications for a circuit or electronic structure may range from low-level transistor material layouts to high-level description languages. A high-level of representation may be used to design circuits and systems, using a hardware description language ('HDL') such as VHDL, Verilog, System Verilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding tools of that layer (e.g., a formal verification tool). A design process may use a sequence depicted in FIG. 5. The processes described by be enabled by EDA products (or tools).

During system design 514, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 516, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 518, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 520, the netlist is checked for compliance with timing constraints and for correspondence with the HDL code. During design planning 522, an overall floor plan for the integrated circuit is constructed and analyzed for timing and top-level routing.

During layout or physical implementation 524, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 526, the circuit function is verified at the layout level, which permits refinement of the layout design. During physical verification 528, the layout design is checked to ensure that manufacturing constraints are correct, such as DRC constraints, electrical constraints, lithographic constraints, and that circuitry function matches the HDL design specification. After physical verification 528, the present system and method includes the ECO router 521 and the signoff timer 523 performing the optimizations (adjustments) discussed throughout this document. During resolution enhancement 530, the geometry of the layout is transformed to improve how the circuit design is manufactured.

During tape-out, data is created to be used (after lithographic enhancements are applied if appropriate) for production of lithography masks. During mask data preparation 532, the 'tape-out' data is used to produce lithography masks that are used to produce finished integrated circuits.

A storage subsystem of a computer system (such as computer system 600 of FIG. 6) may be used to store the programs and data structures that are used by some or all of the EDA products described herein, and products used for development of cells for the library and for physical and logical design that use the library.

Figure 6:
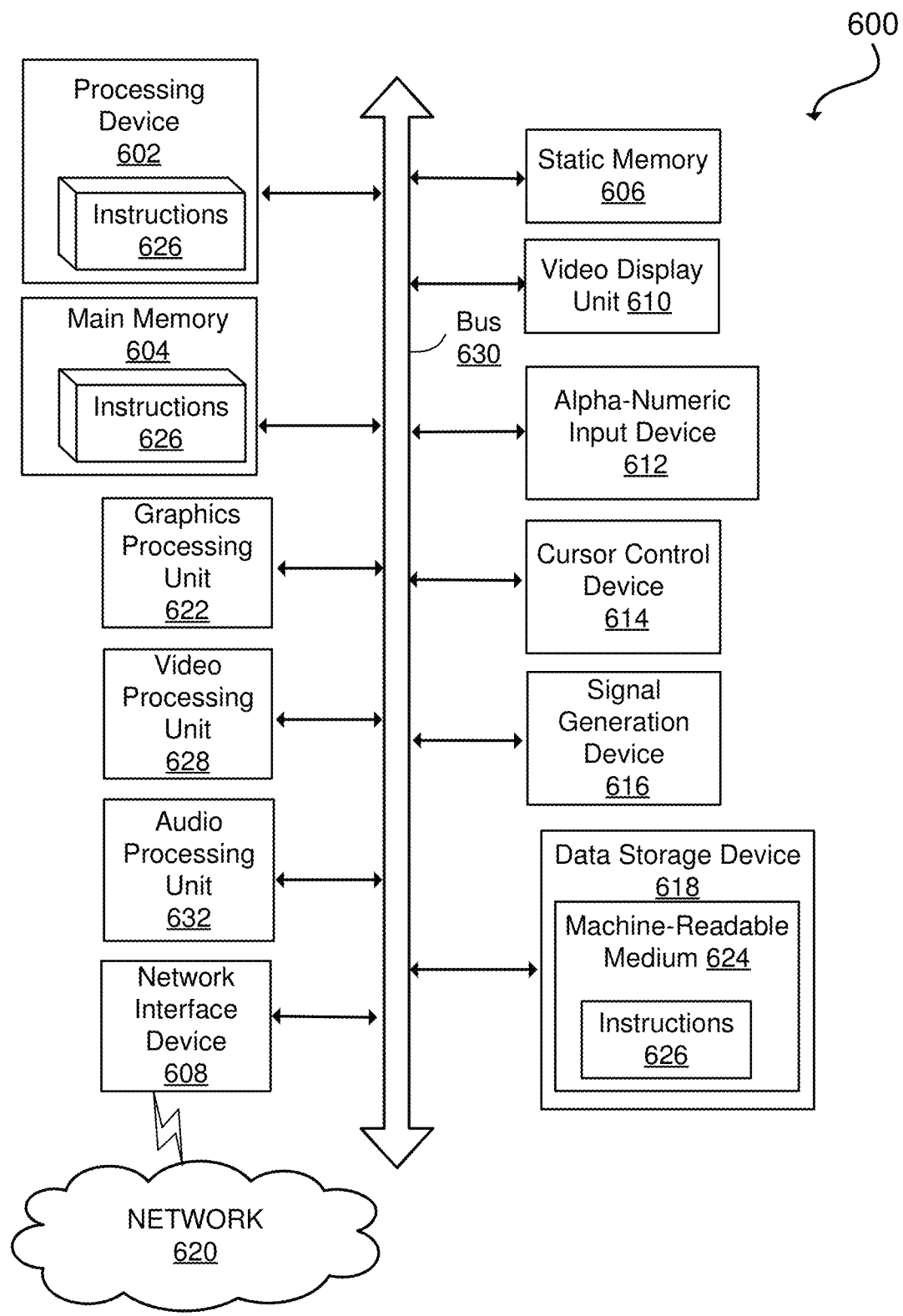
FIG. 6 depicts a diagram of an example computer system in which embodiments of the present disclosure may operate.

FIG. 6 illustrates an example machine of a computer system 600 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM), a static memory 606 (e.g., flash memory, static random access memory (SRAM), etc.), and a data storage device 618, which communicate with each other via a bus 630.

Processing device 602 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 may also be one or more special-purpose processing devices such as an application specific integrated circuit (ASIC), a field programmable gate array (FPGA), a digital signal processor (DSP), network processor, or the like. The processing device 602 may be configured to execute instructions 626 for performing the operations and steps described herein.

The computer system 600 may further include a network interface device 608 to communicate over the network 620. The computer system 600 also may include a video display unit 610 (e.g., a liquid crystal display (LCD) or a cathode ray tube (CRT)), an alphanumeric input device 612 (e.g., a keyboard), a cursor control device 614 (e.g., a mouse), a graphics processing unit 622, a signal generation device 616

(e.g., a speaker), graphics processing unit 622, video processing unit 628, and audio processing unit 632.

The data storage device 618 may include a machine-readable storage medium 624 (also known as a non-transitory computer-readable medium) on which is stored one or more sets of instructions 626 or software embodying any one or more of the methodologies or functions described herein. The instructions 626 may also reside, completely or at least partially, within the main memory 604 and/or within the processing device 602 during execution thereof by the computer system 600, the main memory 604 and the processing device 602 also constituting machine-readable storage media.

In some implementations, the instructions 626 include instructions to implement functionality corresponding to the present disclosure. While the machine-readable storage medium 624 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 602 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method of performing an optimization in a circuit layout design, the method comprising:
    determining, from multiple nets within the circuit layout design, a target net that has one or more performance characteristics that are outside a range of constraints;
    determining, from the multiple nets, a non-critical net that has the one or more performance characteristics that are within the range of the constraints;
    forming a first bounding box to surround the target net;
    removing the non-critical net within the first bounding box;
    adjusting, by a processor, one or more of a shape and a location of the target net after the non-critical net within the first bounding box is removed, such that the one or more performance characteristics of the target net improves to be within the range of the constraints;
    restoring the non-critical net within the first bounding box; and
    adjusting, by the processor, one or more of a shape and a location of the non-critical net such that the one or more performance characteristics of the non-critical net remains within the range of the constraints.

2. The method of claim 1, wherein the one or more of the shape and the location of the one or more of the non-critical net and the target net is adjusted in dependence on one or more of (a) routing constraints including net-level non-default routing rules and (b) shape-level controls.

3. The method of claim 1, wherein the one or more performance characteristics of the target net changes as a result of the adjusting of the non-critical net, such that the one or more performance characteristics of the target net are within the range of the constraints.

4. The method of claim 1, wherein the adjusting further comprises adjusting both (i) the non-critical net, such that the one or more performance characteristics of the non-critical net is changed and remains within the range of the constraints and (ii) the target net.

5. The method of claim 1, wherein the adjusting of the target net includes rerouting the target net.

6. The method of claim 1, wherein the adjusting further comprises adjusting the location of one or more of the non-critical net and the target net based on one or more of (i) changing a layer of the one or more of the non-critical net and the target net and (ii) changing a spacing of the one or more of the non-critical net and the target net with respect to other nets.

7. The method of claim 1, wherein the adjusting further comprising adjusting the shape of one or more of the non-critical net and the target net based on changing a width of the one or more of the non-critical net and the target net.

8. The method of claim 1, further comprising:
determining that the adjusted target net has a negative impact on the one or more performance characteristics of the multiple nets, such that the one or more performance characteristics of a net of the multiple nets has changed from being within the range of the constraints to being outside the range of the constraints; and
reverting the adjusted target net to the original target net based on the determination that the adjusted target net has the negative impact on the one or more performance characteristics of the multiple nets.

9. The method of claim 1, wherein the adjusting of the non-critical net includes rerouting the non-critical net.

10. The method of claim 1, further comprising:
determining that the adjusted non-critical net has a negative impact on the one or more performance characteristics of the multiple nets, such that the one or more performance characteristics of a net of the multiple nets has changed from being within the range of the constraints to being outside the range of the constraints; and
reverting the adjusted non-critical net to the original non-critical net based on the determination that the adjusted non-critical net has the negative impact on the one or more performance characteristics of the multiple nets.

11. The method of claim 1,
wherein the one or more performance characteristics includes delay characteristics, identified as slack, and
wherein the target net is determined as having slack that is outside the range of the constraints.

12. The method of claim 1, wherein the determined non-critical net is determined, from the multiple nets, as a net having all performance characteristics that are within the range of the constraints.

13. The method of claim 1,
wherein the one or more performance characteristics includes delay characteristics, identified as slack, and
wherein the non-critical net is determined as having slack that is within the range of the constraints.

14. The method of claim 1,
wherein the one or more performance characteristics includes delay characteristics, identified as slack,
wherein the non-critical net is determined as having a positive slack,
wherein the adjusting of the non-critical net includes rerouting the non-critical net, such that the positive slack is reduced and yet remains within the range of the constraints,
wherein the target net is determined as having a negative slack,
wherein the adjusting of the target net includes rerouting the target net, and
wherein, as a result of the rerouting of the non-critical net and the target net, the target net has a positive slack.

15. The method of claim 1, further including:
determining, from the multiple nets, a neighboring net having the one or more performance characteristics decreased by the adjusting of the target net;
forming a second bounding box to surround the adjusted target net and at least a portion of the neighboring net; and
rerouting the determined neighboring net that is within the second bounding box based on (i) routing constraints including net-level non-default routing rules and (ii) shape-level controls.

16. The method of claim 15, further comprising:
determining whether the adjusted non-critical net, the adjusted target net and the rerouted neighboring net satisfy acceptance criteria including one or more of a number of shapes and vias, a final route length, a resistance, a capacitance, and an effective coupling length;
in dependence upon a determination that one of the adjusted non-critical net, the adjusted target net and the rerouted neighboring net does not satisfy the acceptance criteria, automatically applying a different adjustment to the one of the adjusted non-critical net, the adjusted target net and the rerouted neighboring net; and
in dependence upon a determination that the adjusted non-critical net, the adjusted target net and the rerouted neighboring net satisfy the acceptance criteria, adopting the adjusted non-critical net, the adjusted target net and the rerouted neighboring net.

17. The method of claim 1, wherein the adjusting selects a desired adjustment scenario from multiple adjustment scenarios that results in a desired distribution of performance characteristics across the non-critical net and the target net.

18. The method of claim 1, wherein the adjusting of the non-critical net and the target net includes rerouting of the one or more of the non-critical net and the target net by changing a path of the one or more of the non-critical net and the target net on a same layer.

19. A system comprising:
a memory storing instructions; and
a processor, coupled with the memory and to execute the instructions, the instructions when executed cause the processor to perform operations including:
determining, from multiple nets within a circuit layout design, a target net that has one or more performance characteristics that are outside a range of constraints;
determining, from the multiple nets, a non-critical net that has the one or more performance characteristics that are within the range of the constraints;
forming a first bounding box to surround the target net;
removing the non-critical net within the first bounding box;
adjusting, by a processor, one or more of a shape and a location of the target net after the non-critical net within the first bounding box is removed, such that the one or more performance characteristics of the target net improves to be within the range of the constraints;

restoring the non-critical net within the first bounding box; and adjusting, by the processor, one or more of a shape and a location of the non-critical net such that the one or more performance characteristics of the non-critical net remains within the range of the constraints.

20. A non-transitory computer readable medium comprising stored instructions, which when executed by a processor, cause the processor to perform operations comprising:

determining, from multiple nets within a circuit layout design, a target net that has one or more performance characteristics that are outside a range of constraints;

determining, from the multiple nets, a non-critical net that has the one or more performance characteristics that are within the range of the constraints;

forming a first bounding box to surround the target net;

removing the non-critical net within the first bounding box;

adjusting, by a processor, one or more of a shape and a location of the target net after the non-critical net within the first bounding box is removed, such that the one or more performance characteristics of the target net improves to be within the range of the constraints;

restoring the non-critical net within the first bounding box; and adjusting, by the processor, one or more of a shape and a location of the non-critical net such that the one or more performance characteristics of the non-critical net remains within the range of the constraints.

\* \* \* \* \*